United States Patent [19]

Inada et al.

[11] Patent Number: 5,037,769
[45] Date of Patent: Aug. 6, 1991

[54] METHOD OF MANUFACTURING SEMICONDUCTOR DEVICE

[75] Inventors: Masanori Inada, Nara; Kazuo Eda, Hirakata; Yorito Ota, Kobe, all of Japan

[73] Assignee: Matsushita Electric Industrial Co., Ltd., Osaka, Japan

[21] Appl. No.: 330,956

[22] Filed: Mar. 28, 1989

Related U.S. Application Data

[62] Division of Ser. No. 900,631, Aug. 26, 1986, abandoned.

[30] Foreign Application Priority Data

Aug. 26, 1985 [JP] Japan .................................. 60-186902
Aug. 29, 1985 [JP] Japan .................................. 60-190777
Aug. 29, 1985 [JP] Japan .................................. 60-190786

[51] Int. Cl.$^5$ .................... H01L 21/20; H01L 21/331
[52] U.S. Cl. ..................................... 437/31; 437/22; 437/126; 437/130; 437/133; 437/909; 148/DIG. 10; 148/DIG. 72
[58] Field of Search ............... 437/31, 126, 130, 133, 437/909, 22; 148/DIG. 10, DIG. 11, DIG. 72, DIG. 84; 357/16, 34, 56

[56] References Cited

U.S. PATENT DOCUMENTS

| 4,032,951 | 6/1977 | De Winter et al. ............. 357/16 X |
| 4,055,443 | 10/1977 | Akimov et al. ........................ 437/22 |
| 4,237,471 | 12/1980 | Pommerpenig ................. 357/16 X |
| 4,593,457 | 6/1986 | Birritella .............................. 437/31 |
| 4,635,343 | 1/1987 | Kuroda ............................... 437/133 |
| 4,651,410 | 3/1987 | Feygenson ......................... 437/31 |
| 4,662,058 | 5/1987 | Cirillo, Jr. et ...................... 437/22 |

FOREIGN PATENT DOCUMENTS

| 0032173 | 2/1984 | Japan .................................... 437/22 |
| 0217326 | 12/1984 | Japan ....................... 148/DIG. 84 |

OTHER PUBLICATIONS

Asbeck et al., "(Ga,Al)As/GaAs Bipolar Transistors for Digital Integrated Circuits," Conference: International Electron Devices Meeting, Wash., D.C., (7-9 Dec. 1981), pp. 629-632.
Kroemer, "Heterostructure Bipolar Transistors and Integrated Circuits," Proceedings of the IEEE, vol. 70, No. 1, Jan. 82, pp. 13-25.
Asbeck et al., "GaAs/(Ga,Al) As Heterojunction Bipolar Transistors with Buried Oxygen-Implanted Isolation Layers," IEEE Electron Device Letters, vol. EDL-5, No. 8, Aug. 1984, pp. 310-312.
Shang, "In SbAs Infrared Sensor," IBM Technical Disclosure Bulletin, vol. 14, No. 11, Apr. 1972, p. 3289.
"Heterostructure Bipolar Transistors and Integrated Circuits", Proceedings of the IEEE, vol. 70, No. 1, Jan. 1982, Herbert Kroemer, pp. 13-25.

Primary Examiner—Brian E. Hearn
Assistant Examiner—Tuan Nguyen
Attorney, Agent, or Firm—Wenderoth, Lind & Ponack

[57] ABSTRACT

A semiconductor device of a multilayer structure comprising semiconductor materials of different properties manufactured by using at least a step of epitaxially forming a semiconductor material layer on a substrate and a passivation film layer thereover, a step of introducing impurities into specific portions of the epitaxially formed semiconductor material layer and a step of removing the passivation film layer formed directly above the epitaxially formed semiconductor material layer within an epitaxial device and then applying epitaxial growing. Impurities introduced additionally to specific portions of the layer inside are substantially eliminated at the boundary adjacent the layer above the region introduced with impurities and the properties of the thus-produced semiconductors vary abruptly at the boundary between the layer in which the impurities are introduced and the layer thereabove. The material used for the passivation film layer comprises one that can be epitaxially formed and easily removed at a temperature and in a atmosphere under which the epitaxially formed layer below the passivation film are not decomposed or evaporized.

19 Claims, 8 Drawing Sheets

METHOD OF MANUFACTURING SEMICONDUCTOR DEVICE

This application is a continuation divisional, of now abandoned application Ser. No. 06/900,631, filed Aug. 26, 1986.

BACKGROUND OF THE INVENTION

1. Field of the Invention

This invention concerns a semiconductor device such as a bipolar transistor (hereinafter simply referred to as BT) which is manufactured by using a multilayer structure material formed through the epitaxy of semiconductor materials of different properties and which is useful as an ultrahigh frequency and ultrahigh speed transistor and, particularly a heterojunction bipolar transistor (hereinafter simply referred as HBT) a semiconductor laser and a light emitting diode, as well as a method of manufacturing same.

2. Description of the Prior Art

High speed operation factors $f_t$ and $f_m$ for BT are represented as:

$$f_t = \frac{1}{2\pi(\tau_e + \tau_b + \tau_c + \tau_{cc})}$$

$$f_m = \sqrt{f_t} / \sqrt{8\pi R_b C_{bc}}$$

where $\tau_e$ (emitter depletion layer transit time) = $re(C_{bc} + C_{eb} + C_{pb})$, $\tau_b$ (base trainsit time) = $W_b^2/nD_b$, $\tau_c$ (collector depletion layer transit time) = $W_c/2V_s$, $\tau_{cc}$ (collector depletion layer charging time) = $(R_{ee} + R_c) \cdot (C_{bc} + C_{pc})$, Rb: base resistance,
Cbc: base-collector capacitance,
Ceb: base-emitter capacitance,
Cpb: base layer parasitic capacitance,
Cpc: collector layer parasitic capacitance,
Wb: base layer thickness,
Db: base layer diffusion coefficient,
Wc: collector depletion layer thickness,
Vs: collector transit speed,
Ree: emitter contact resistance, and
Rc: collector resistance.

As can be seen from the formulas, it is important in a BT to decrease the junction capacitance such as the Cbc and Ceb, the base layer thickness, the ohmic contact resistance and the base resistance in order to increase $f_t$ and $f_m$. Above all, it is important to decrease the base resistance Rb and Cbc in order to increase the $f_m$. In view of the above, attempts have been made for reducing the size of transistors.

In an HBT using a semiconductor material as an emitter having a band gap larger than that of the base, since the leaks of positive holes from the base to the emitter is suppressed (in the case of npn type), the base can be doped to a higher extent, while the emitter and the collector can be doped to a lower extent contrary to an ordinary BT. Since this can reduce the base resistance Rb which is important for increasing the operation speed and the frequency of the transistor, it is advantageous for the increase of the factor $f_m$. Further, in the usual bipolar transistor, Cbc and Ceb are represented as a product of the factors Ceb (n, h), Cbc (n, h) of the junction capacitance depending on the doping and the junction areas Aeb, Abc. Since the emitter and the collector are doped at a low concentration while the base is doped at a high concentration in the heterojunction bipolar transistor, Ceb (n, h) and Cbc (n, h) are dependent only on the doping of the emitter and the collector and Ceb and Cbc are represented as:

$$C_{eb} \propto \sqrt{N_e} \cdot A_{eb} \quad C_{bc} \propto \sqrt{N_c} \cdot A_{bc}$$

Accordingly, since Ceb and Cbc are made smaller in an HBT by reason of the hetero-structure as compared with the usual BT, $\tau_e$ and $\tau_{cc}$ are made smaller to provide an advantage for the increase of $f_t$. Further, since the Cbc is made smaller, it provides an advantage in that $f_m$ is increased coupled with a decrease in Rb. For making the HBT operation speed higher, it is important to optimize the device structure in addition to the optimization of the hetero-structure itself. A normal structure in which the emitter is situated above and an inverted type in which the collector is situated above are fundamentally possible in the usual BT as the well as HBT (H. Kroemer: "Hetero-structure Bipolar Transistors and Integrated Circuits" Proc. IEEE, vol. 70, p. 13, 1982). In the normal type, it is advantageous to decrease the size of the emitter for making the Ceb smaller. In addition, if the collector can be made smaller by making the periphery of the collector semi-insulating, a remarkable increase in the $f_t$, $f_m$ is possible since the Cbc can be made smaller (P. M. Asbeck, et al. "GaAs/(Ga,Al)As Heterojunction Bipolar Transistors with Buried Oxygen Inplanted Isolation Layers", IEEE, EDL-5, p. 311 (1984)). Further, in a inverted structure, since the collector is situated above, it is essentially advantageous to reduce the size of the collector for reducing the Cbc. Further, since the Ceb is reduced if the periphery of the emitter can be semi-insulated, $f_t$ and, accordingly, $f_m$ can be increased. It has been attempted, for such an objective, to fabricate semiconductor materials of different properties into a multi-layer structure suitable for the manufacture of BT through an epitaxy and then making the periphery of the collector at a specific portion inside of the multilayer structure semi-insulating by ion inplantation from above (P. M. Asbeck, et al. "GaAs/(Ga,Al)As Heterojunction Bipolar Transistors with Burried Oxygen Inplanted Isolation Layers", IEEE, EDL-5, p. 311 (1984)).

However, introduction of impurities into the specific portion inside of the multilayer structure from above by means of ion implantation or diffusion is not desirable as it produces undesired effects on the transistor characteristics. This is because the introduced impurities form a distribution in the direction of the depth and the impurities are distributed above the specific portion requiring the introduction of the impurities and the crystals are inevitably injured due to the great amount of impurities passed therethrough.

SUMMARY OF THE INVENTION

The object of this invention is to provide a semiconductor device excellent in high frequency characteristics and a method of manufacturing same.

Another object of this invention is to provide a semiconductor device with a multilayer structure in which additionally introduced impurities are present only in the desired layer and are not substantially present in other layers and a method of manufacturing same.

A further object of this invention is to provide a semiconductor device with a multilayer structure capable of avoiding impairment to other layers of the device when the impurities are introduced additionally to desired layers and a method of manufacturing same.

A still further object of this invention is to provide materials suitable as a passivation film for the semiconductor device during the course of manufacture.

The semiconductor device according to the present invention has a structure wherein impurities additionally introduced to a specific portion of a specific layer in a multilayer structure comprising semiconductor materials of different properties are eliminated substantially abruptly at the boundary between the portion of the layer where the impurities are introduced and the layer thereabove, and the wherein properties of the semiconductor at the boundary between the layer in which impurities are introduced and the layer thereabove vary abruptly from the properties of the lower layer and upper layer.

The method of manufacturing the semiconductor device as described above comprises the step of forming layers in the multilayered structure by means of epitaxial growing of the layer to be introduced with impurities, the step of epitaxially forming a passivation film thereover, the step of introducing impurities to a desired portion of the layer introduced with the impurities, a step of removing the passivation film and the step of epitaxially growing again the remaining layers of the multilayer structure over the layer introduced with the impurities. While the impurity introducing step may be carried out either inside or outside of the epitaxy device, the effects of the passivation film can significantly be obtained in the case of external introduction. The introduction of impurities can be carried out, for example, by ion inplantation or diffusion. The material usable for the passivation film can include those that can be removed with ease at a temperature and in an atmosphere under which the materials formed therebelow are not decomposed or evaporated and can be formed by epitaxial growth. The passivation film serves to prevent the materials below from being denatured in contact with the atmosphere at the step of introducing the impurities.

In the case, where the semiconductor device is a BT, the following process is applied. In the normal type, there are at first epitaxially formed at least a doped or undoped semiconductor material layer as the semiconductor material layer for forming the collector on a substrate material and, further a passivation film layer for protecting the surface of an epitaxially grown layer on the substrate material. In the case of the inverted type, there are epitaxially formed at least a doped or undoped layer so as to form the emitter as the semiconductor material layer for forming the emitter and, further, a passivation film layer for protecting the surface of the epitaxially grown layer. Then, in the case where impurities are previously contained, the portion for forming the collector or emitter region is left as it is and other impurities are introduced to the periphery thereof, thereby making the periphery semi-insulating by applying an impurity introduction process such as ion implantation or diffusion. In the case of an undoped semi-insulating state, impurities are introduced into the region for forming the collector or emitter region thereby forming the collector or emitter region. Then, the passivation film is effectively removed in an epitaxial device and, thereafter, semiconductor material layers required for forming BT are epitaxially formed. In this way, a BT is formed using such a structure that (1) impurities are additionally introduced to the specific portions inside of the multilayer structure formed through epitaxy, (2) the introduced impurities are substantially abruptly eliminated at the boundary between the portion introduced with the impurities and the epitaxial layer directly formed thereover, (3) the properties of the semiconductor vary substantially abruptly at the boundary between the layer introduced with the impurities and the layer epitaxially formed thereover and (4) crystals above the layer introduced with the impurities are not injured.

The following process is also applicable. For the first epitaxial growth, at least a highly doped layer having carriers of a type identical with the collector or an undoped semi-insulating layer and a passivation film layer thereover are epitaxially formed as the epitaxially formed semiconductor layer below the collector in the normal type. At least a highly doped layer or an undoped semi-insulating layer having carriers of a type identical with the emitter and a passivation film layer thereover are epitaxially formed below the emitter as the epitaxially formed semiconductor layer in the inverted type. Then, in the case of the highly doped layer, the peripheral layer is semi-insulated while leaving a portion smaller in size than that of the collector or emitter region and included within a range just beneath the collector or emitter region by introducing impurities by ion implantation or diffusion. In the case of using the undoped semi-insulating layer, a highly doped region is formed by introducing impurities to the portion smaller in size than that the collector or emitter region and included within a range just beneath the collector or emitter region. Then, after effectively removing the passivation film layer, semiconductor material layers required for forming the BT is epitaxially formed. In this case, impurities are introduced from above the multi-layer structure materials thus formed so as to make the collector or emitter region smaller and convert at least the periphery of the collector or the emitter into a region having carriers of a type identical with that of the base. Further, the ion implantation or like other process is carried out by applying a passivation film composed of a material capable of epitaxial growing which can be removed with ease at a temperature and in an atmosphere under which the materials formed epitaxially therebelow are not decomposed or evaporated, particularly, a passivation film of a plural layer structure comprising material that is epitaxially formed on the aforementioned passivation film material and can selectively be removed with ease outside of the epitaxial device. This is carried out while preventing the underlying materials from being contaminated with air or other atmosphere and, subsequently, epitaxial growth again is carried out after removing the passivation film to form a multilayer structural material having a regrown boundary of good quality.

In the manufacturing method according to this invention, a multilayer structure material can be formed effectively, in which impurities are introduced into a specific portion of a layer inside the multilayer structure composed of epitaxially formed semiconductor materials of different properties, and wherein the introduced impurities are substantially abruptly eliminated at the boundary between the portion of the layer introduced with the impurities and the layer thereabove. As a result, the properties of the semiconductor vary substantially at the boundary between the layer in which impurities are introduced and the layer thereabove. Accordingly, it is possible to effectively form a minute collector region in the normal BT in which the emitter is disposed above, and a minute emitter region in an inverted type BT in which the collector is disposed above, whereby the cbc and Ceb can be made extremely smaller. Further, since the distributin of the impurities is limited only to the portion requiring the introduction of the impurities and since the crystals in the layer above the layer introduced with the impurities do not suffer from injury due to the passage of the impurities, the performance of the BT is not impaired.

Therefore, a BT of high performance can be manufactured. The bipolar transistor and a method of manufacturing the same according to this invention will now be described while referring to the preferred embodiments in conjunction with the drawings.

BRIEF DESCRIPTION OF THE DRAWINGS

In FIGS. 1 through 8, are shown:

Figure 1A:
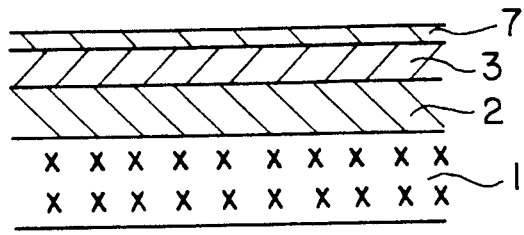
FIGS. 1 through 8 illustrate semiconductor devices using multilayered structures composed of epitaxially formed semiconductor materials of different properties according to this invention and a method of manufacturing same in the case of HBT.

1: A substrate in which epitaxial growth is carried out,
2: highly doped semiconductor layer formed through epitaxial growth for facilitating the formation of ohmic contact of a collector, 2-a: An HBT-forming region of 2, 2-b: a portion of the layer 2 disposed at a region smaller than the size of the collector region situated just beneath the collector region in the layer 2, 2-c: a semi-insulating region formed to the periphery of the region 2-b in the layer 2 by uniformly introducing impurities, 2-d: a portion of 2-c disposed in the HBT-forming region, 3: a semiconductor material layer doped for forming the collector, 3-a: collector region formed in the layer 3, 3-b: a semi-insulating region disposed in the layer 3 formed by the introduction of impurities, 3-c: a portion of 3-b disposed in an HBT-forming portion, 3-d: a region having carriers of a type identical with that of the base disposed uniformly to the periphery of the collector region in the layer 3, 3-e: a portion of 3-d situated in the HBT-forming portion, 4: a semiconductor layer doped for forming the base, 4-a: a base region for forming an emitter-base and collector-base a junction, 4-b: an external base region situated to HBT-forming portion, 5: a semiconductor layer doped for forming an emitter, 5-a: emitter region disposed in the layer 5, 5-b: a region having carriers of a type identical with the base disposed uniformly to the periphery of 5-a in the layer 5 formed by introducing impurities, 5-c: a semi-insulating region disposed uniformly to the periphery of 5-a in the layer 5 by introducing impurities, 5-d: a portion of 5-c situated in an HBT-forming portion, 5-e: a portion of 5-b situated in an HBT-forming portion, 6: an epitaxially formed highly doped semiconductor layer for facilitating the formation of the emitter ohmic contact, 6-a: an ohmic contact forming region of the emitter formed in the portion of 6, 6-b: a region having carriers of a type identical with that of the base formed at the periphery of 6-a in the layer 6 by introducing impurities, 6-c: a portion situated in an HBT forming portion in the layer 6, 6-d: a portion of the layer 6 disposed to a region smaller than the size of and disposed just beneath the emitter region, 6-e: a semi-insulating region disposed uniformly to the periphery of 6-d in the layer 6 by introducing impurities, 6-f: a portion of 6-e situated in HBT-forming·portion, 7: an epitaxially formed passivation film layer, 8: an emitter electrode, 9: a base electrode, 10: a collector electrode, 11: an epitaxially formed un-doped semiconductor layer for forming the collector region by introducing impurities, 11-a: a collector region formed in the layer 11 by introducing impurity, 11-b: a portion of 11 situated in HBT-forming portion, 12: an un-doped semi-insulating layer formed below the layer for forming the collector region, 12-a: a portion of the layer 12 highly doped by introducing the impurities within a range smaller than the size of and situated just beneath the collector region, 12-b: a portion of 12 situated in an HBT-forming region, 13: an epitaxially formed un-doped semi-conductor layer for forming the emitter by introducing impurities, 13-a: an emitter region formed in the layer 13 by introducing impurities, 13-b: a portion of the layer 13 situated in an HBT-forming region, 14: an un-doped semi-insulating layer disposed below the layer for forming the emitter region, 14-a: a portion of the layer 14 highly doped by introducing impurities within a range smaller than the size of and situated just beneath the emitter region, 14-b: a portion of the layer 14 situated in HBT-forming portion.

DESCRIPTION OF THE PREFERRED EMBODIMENTS

EXAMPLE 1

Figure 1B:
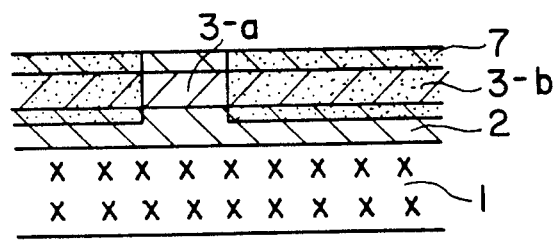
Figure 1C:
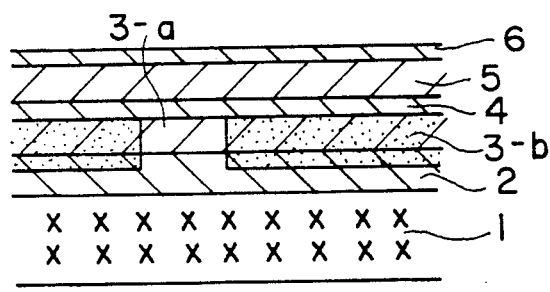
Figure 1D:
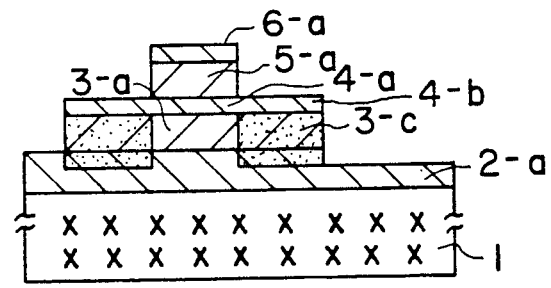
Figure 1E:
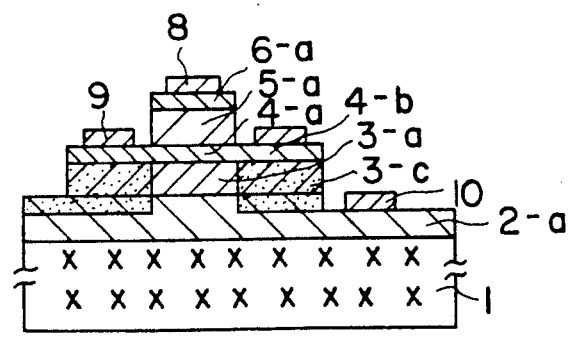

FIG. 1 illustrates a method of manufacturing a normal type HBT according to this invention and an example of the HBT structure formed thereby. As shown in FIG. 1(a), there are epitaxially formed at first, on a substrate 1, a highly doped semiconductor material layer 2 having carriers of a type identical with that of a collector, a semiconductor material layer 3 for forming the collector and a passivation film layer 7. Then, as shown in FIG. 1(b), the peripheral portion around the region 3-a formed as a minute collector is converted by way of ion implantation into a semi-insulating region 3-b. Then, after removing the passivation film layer 7 in an epitaxial device, there are epitaxially formed, as shown in FIG. 1(c), at least a semiconductor material layer 4 for forming a base, a semiconductor material layer 5 for forming an emitter and a highly doped semiconductor material layer 6 for facilitating the formation of the emitter ohmic contact. Then, as shown in FIG. 1(d), an HBT device structure having an emitter region composed of 5-a and 6-a, an external base region 4-b and a region 2-a for taking out the collector electrode by means of photolithography and etching. Then, as shown in FIG. 1(e), an emitter electrode 8, a base electrode 9 and a collector electrode 10 are formed to manufacture an HBT according to this invention.

In the structure according to this invention, impurities introduced for forming the peripheral portion around the collector are restricted to the layer for forming the collector and the lower portion thereof but are not substantially present in the base region. Further, since the impurities introduced to the peripheral portion around the collector do not pass through the base region, the crystals do not undergo injuries.

EXAMPLE 2

Figure 2A:
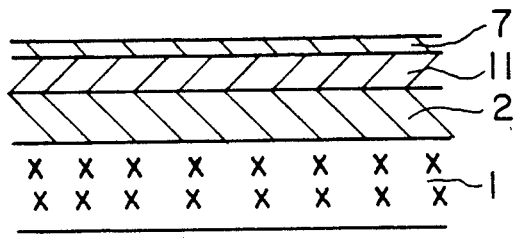
Figure 2B:
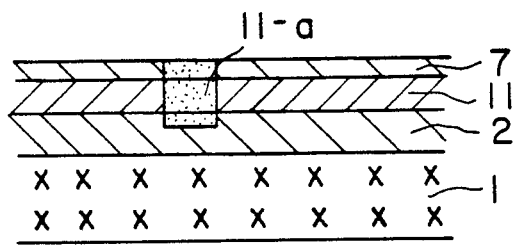
Figure 2C:
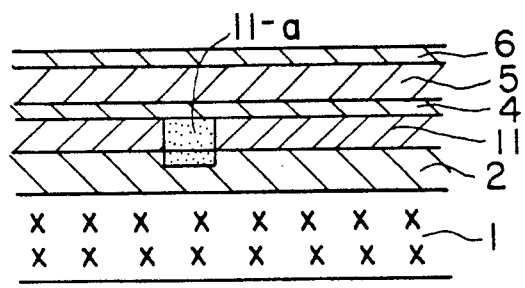
Figure 2D:
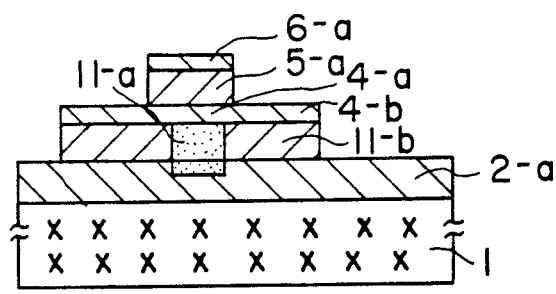
Figure 2E:
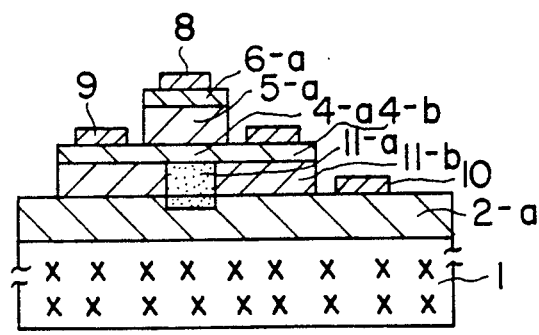

FIG. 2 illustrates a method of manufacturing a normal type HBT according to this invention and an example of the HBT structure formed thereby. As shown in FIG. 2(a), there are epitaxially formed at first, on a substrate 1, a highly doped semiconductor material layer 2 for facilitating the formation of the collector ohmic contact, an un-doped semiconductor material layer 11 for forming a collector region and a passivation film layer 7. Then, as shown in FIG. 2(b), a collector region 11-a is formed at a portion of the undoped layer 11 by means of ion implantation. Then, after removing the passivation film layer 7 in an epitaxial device, there are epitaxially formed as shown in FIG. 2(c), at least a semiconductor material layer 4 for forming a base region, a semiconductor material layer 5 for forming an emitter region and a highly doped semiconductor material layer 6 for facilitating the formation of the emitter ohmic contact. Then, an HBT device structure shown in FIG. 2(d) is formed by means of photolithography and etching. Then, an emitter electrode 8, a base electrode 9 and a collector electrode 10 are formed to manufacture a HBT according to this invention.

In this structure, carriers of the collector are formed with additionally introduced impurities and the peripheral portion around the collector forms an undoped semi-insulating region.

EXAMPLE 3

Figure 3A:
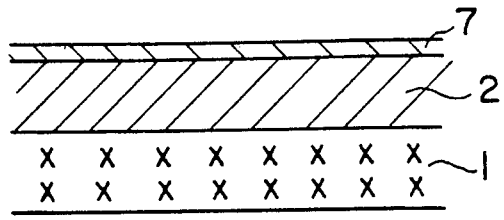
Figure 3B:
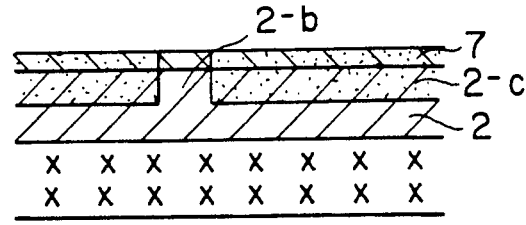
Figure 3C:
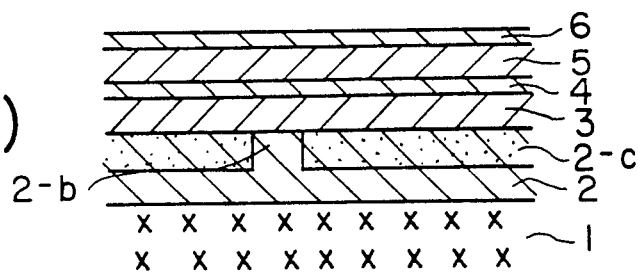
Figure 3D:
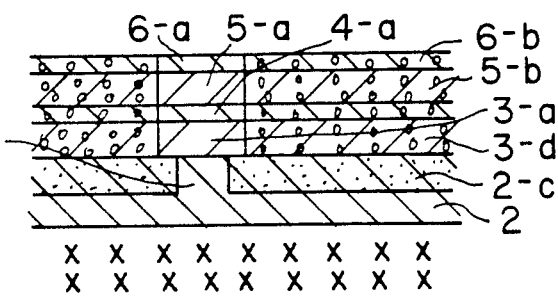
Figure 3E:
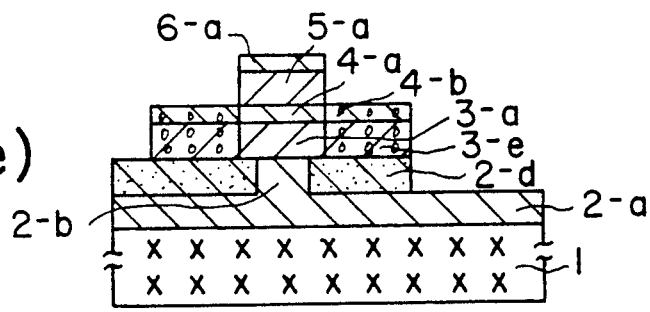
Figure 3F:
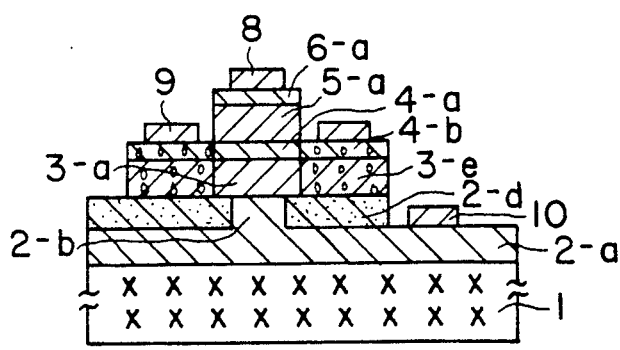

FIG. 3 illustrates a method of manufacturing a normal type HBT according to this invention and an example for the HBT structure formed thereby. As shown in FIG. 3(a), there are epitaxially formed at first, on a substrate 1, a highly doped semiconductor material layer 2 of a type identical with collector and a passivation film layer 7. Then, as shown in FIG. 3(b), a peripheral region around the collector region is converted into a semi-insulating region 2-c by ion implantation while leaving a region 2-b smaller in size than the size of the collector region and included within a range just beneath the collector region. Then, as shown in FIG. 3(c), after leaving the passivation film layer 7 in the epitaxial device, there are epitaxially formed at least a semiconductor material layer 3 for forming a collector region, a semiconductor material region 4 for forming a base region, a semiconductor material layer 5 for forming an emitter region and a highly doped semiconductor material layer 6 for facilitating the formation of the emitter ohmic contact. Then, as shown in FIG. 3(d), at least the peripheral portion around the collector region 3-a is converted into a region 3-d having carriers of a type identical with that of the base by means of ion implantation. Then, an HBT device structure as shown in FIG. 3(e) is formed by using the same procedures as in Example 1 and, further, an emitter electrode 8, a base electrode 9 and a collector electrode 10 are formed to manufacture an HBT according to this invention shown in FIG. 3(f).

In this structure, the peripheral portion around the collector region 3-a constitutes a semiconductor region 3-e having the carriers of a type identical with that of the base, the layer below the collector region 3-a comprises a highly doped region 2-b of a type identical with that of the collector situated within a range just beneath the collector region 3-a and a semi-insulating region 2-d is formed with additionally introduced impurities at the peripheral portion thereof.

Example 4

Figure 4A:
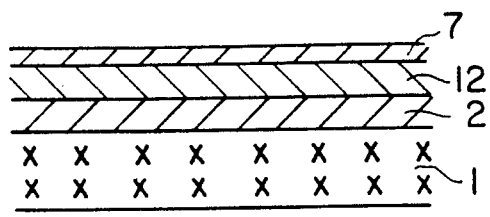
Figure 4B:
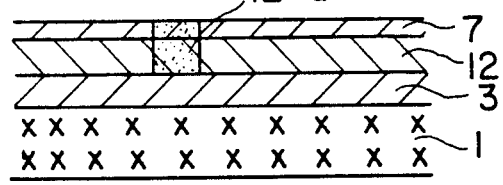
Figure 4C:
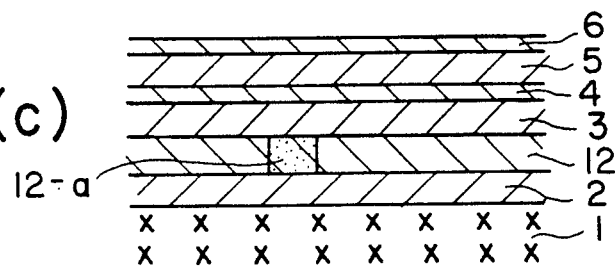
Figure 4D:
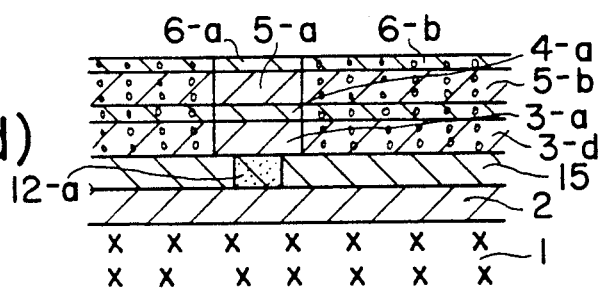
Figure 4E:
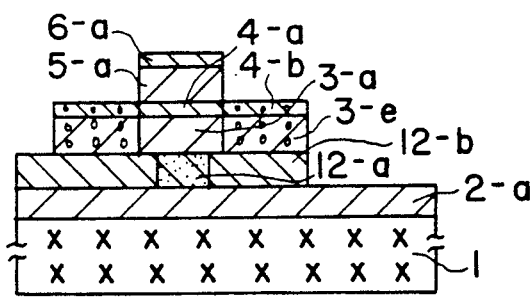
Figure 4F:
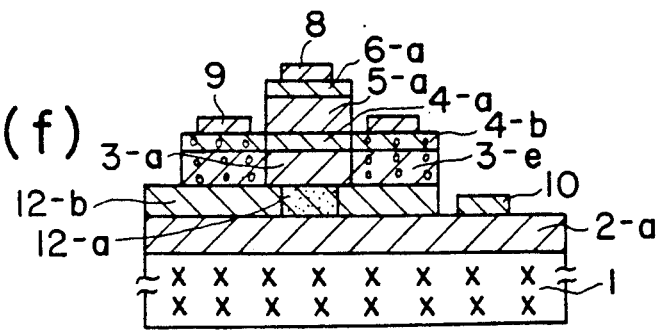

FIG. 4 illustrates a method of manufacturing a normal type HBT according to this invention and an example of a HBT structure formed thereby. As shown in FIG. 4(a), there are epitaxially formed at first, on a substrate 1, a highly doped semiconductor material layer 2 of a type identical with that of a collector, an undoped semiconductor material layer 12 for forming the collector region and a passivation film layer 7. Then, as shown in FIG. 4(b), a portion 12-a of the undoped layer 12 which is smaller in size than the collector region 3-a and situated within a range just beneath the collector region 3-a is converted into the highly doped region 12-a of a type identical with that of the collector region 3-a. Then, as shown in FIG. 4(c), after removing the passivation film layer 7 in an epitaxial device, there are epitaxially formed at least semiconductor material layer 3 for forming the collector region, a semiconductor material layer 4 for forming the base region, a semiconductor material layer 5 for forming the emitter region and a semiconductor material layer 6 for facilitating the formation of the emitter ohmic contact. Then, as shown in FIG. 4(d), at least the peripheral portion around the collector region is converted into a highly doped region 3-d having carriers of a type identical with that of the base. Then, a HBT device structure shown in FIG. 4(e) is formed by using the same procedures as in Example 1 and an emitter electrode 8, a base electrode 9 and a collector electrode 10 are formed to manufacture as HBT according to this invention shown in FIG. 4(f).

In this structure, the peripheral portion around the collector region 3-a forms a semiconductor region 3-e having carriers of a type identical with that of the base and the layer below the collector region 3-a comprises a highly doped region 12-a of a type identical with that of the collector, smaller in size than the collector region 3-a and situated within a range just beneath the collector region 3-a and an undoped semi-insulating region 12-b at the peripheral thereof.

Example 5

Figure 5A:
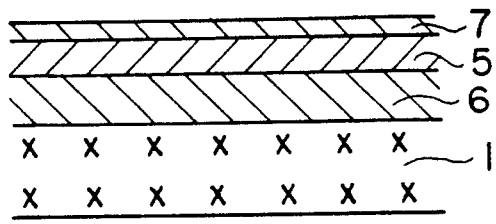
Figure 5B:
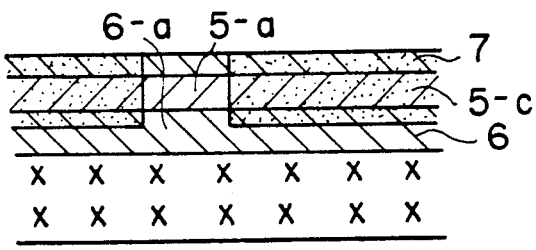
Figure 5C:
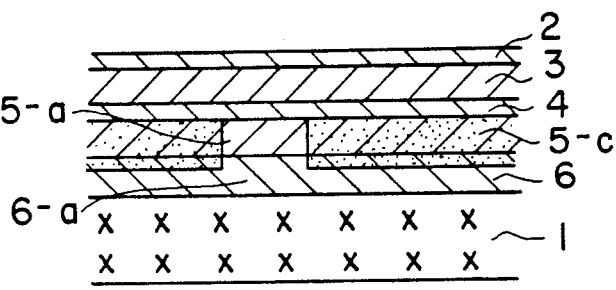
Figure 5D:
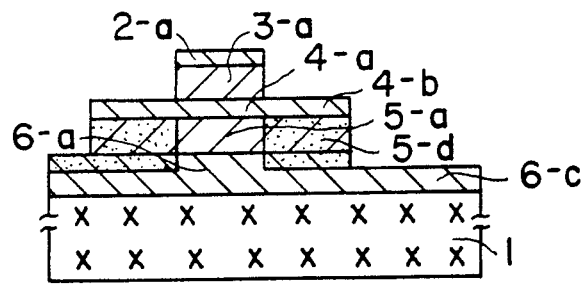
Figure 5E:
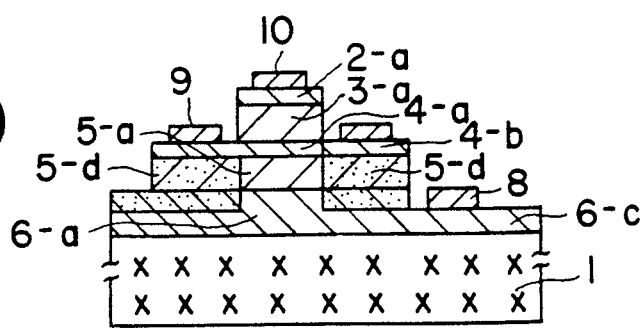

FIG. 5 illustrates a method of manufacturing an inverted type HBT according to this invention and an example of a HBT structure formed thereby. As shown in FIG. 5(a), there are epitaxially formed at first, on a substrate 1, a highly doped semiconductor material layer 6 of a type identical with that of an emitter, a semiconductor material layer 5 for forming an emitter region and a passivation film layer 7. Then, as shown in FIG. 5(b), the peripheral portion around a minute emitter region 5-a is converted into a semi-insulating region 5-c by ion implantation while leaving the region 5-a as it is. Then, after removing the passivation film layer 7 in an epitaxial device, there are epitaxially formed, as shown in FIG. 5(c), at least a semiconductor material layer 4 for forming a base region, a semiconductor material layer 3 for forming a collector region and a semiconductor material layer 2 for facilitating the formation of the collector ohmic contact. Then, a HBT device structure shown in FIG. 5(d) is formed and an emitter electrode 8, a base electrode 9 and a collector electrode 10 are formed as shown in FIG. 5(d) to manufacture a HBT according to this invention as illustrated in FIG. 5(e).

In the structure according to this invention, the distribution of impurities additionally introduced in the layer forming the emitter are restricted and the introduced impurities are not substantially present in the base region, by which crystals are kept from injury.

Example 6

Figure 6A:
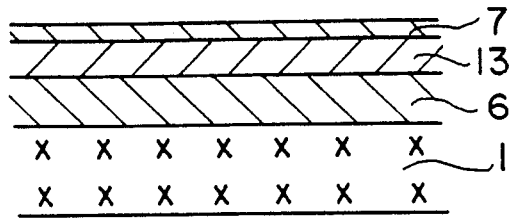
Figure 6B:
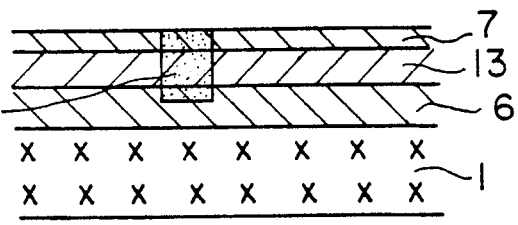
Figure 6C:
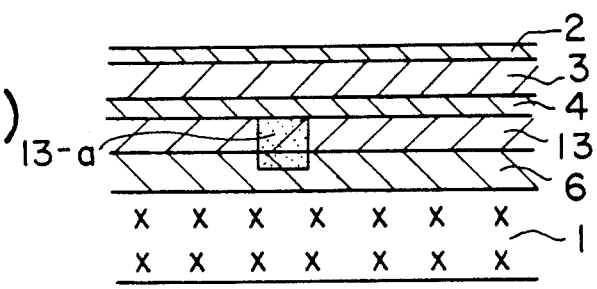
Figure 6D:
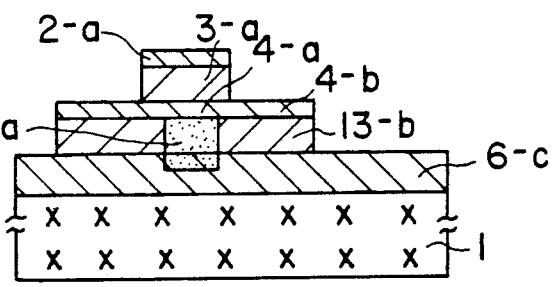
Figure 6E:
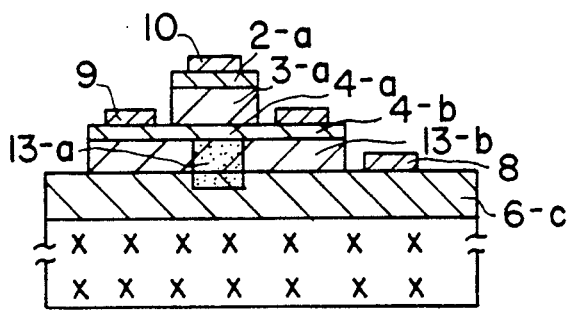

FIG. 6 illustrates a method of manufacturing an inverted type HBT device according to this invention and an example of an HBT structure formed thereby. As shown in FIG. 6(a) there are epitaxially formed at first, on a substrate 1, at least a highly doped semiconductor material layer 6 of a type identical with that of the emitter, an undoped semi-insulating material layer 13 and a passivation film layer 7. Then, as shown in FIG. 6(b), impurities are introduced by ion implantation to a portion for forming an emitter region of the undoped layer 13 to form an emitter region 13-a. Then, after removing the passivation film layer 7 in an epitaxial device, there are formed, as shown in FIG. 6(c), at least a semiconductor material layer 4 for forming a base region, a semiconductor material layer 3 for forming a collector region and a highly doped semiconductor material layer 2 of a type identical with that of the collector. Then, an HBT device structure shown in FIG. 6(d) is formed by the same procedures as in Example 5 and an emitter electrode 8, a base electrode 9 and a collector electrode 10 are formed to manufacture an HBT according to this invention as shown in FIG. 6(e).

In the structure according to this invention, carriers in the emitter region 13-a are formed by additionally introduced impurities and the peripheral portion around the emitter region 13-a is converted into an undoped semi-insulating region 13-b.

Example 7

Figure 7A:
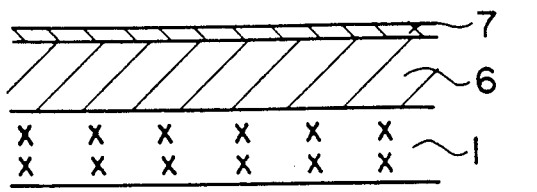
Figure 7B:
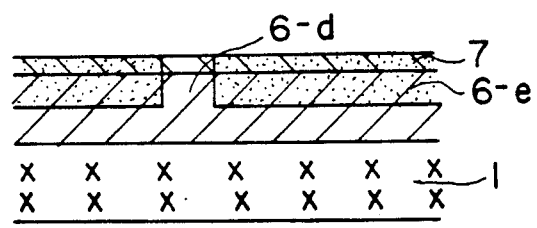
Figure 7C:
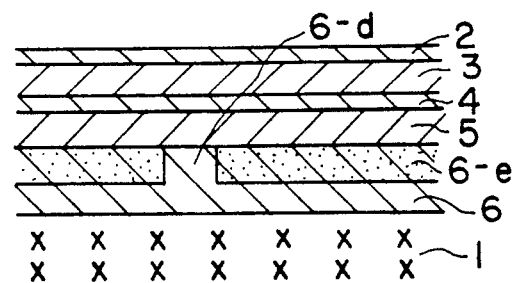
Figure 7D:
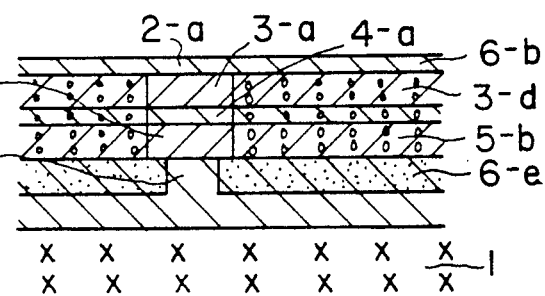
Figure 7E:
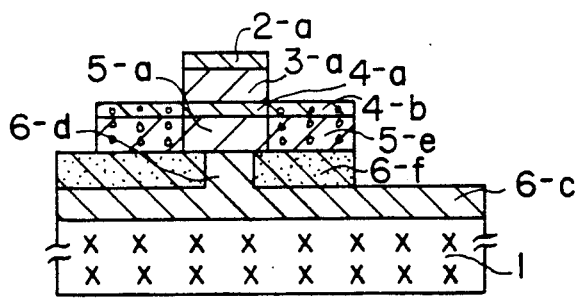
Figure 7F:
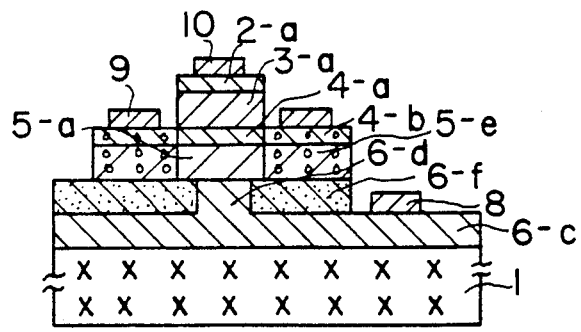

FIG. 7 illustrates a method of manufacturing an inverted type HBT according to this invention and an example of a HBT structure formed therewith. As shown in FIG. 7(a), there are epitaxially formed, at first, 7-a on a substrate 1, a highly doped semiconductor material layer 6 of a type identical with that of an emitter and a passivation film layer 7. Then, as shown in FIG. 7(b), the peripheral portion is converted into a semi-insulating region 6-e by means of ion implantation while leaving a portion 6-d smaller in size than the emitter region 5-a and situated within a range just beneath the region as it is. Then, after removing the passivation film layer 7 in an epitaxial device, there are epitaxially formed, as shown in FIG. 7(c), at least a semiconductor material layer 5 for forming the emitter region, a semiconductor material layer 4 for forming a base region, a semiconductor material layer 3 for forming a collector region and a highly doped semiconductor material layer 2 of a type identical with that of the collector region. Then, as shown in FIG. 7(d), at least the peripheral portion around the emitter region 5-a is converted into a region 5-b having carriers of a type identical with that of the base by ion implantation. Then, an HBT device structure shown in FIG. 7(e) is formed by using the same procedures as in Example 5 and an emitter electrode 8, a base electrode 9 and a collector electrode 10 are formed to manufacture an HBT according to this invention shown in FIG. 7(f).

In the structure according to this invention, the peripheral portion around the emitter region 5-a is converted into a semiconductor region 5-e having carriers of a type identical with that of the base, and the layer below the emitter region 5-a comprises a highly doped region 6-d of a type identical with that of the emitter, smaller in size than the emitter region 5-a and within a range just beneath the emitter region 5-a and the peripheral portion is converted into a semi-insulating region 6-f by additionally introduced impurities.

Example 8

Figure 8A:
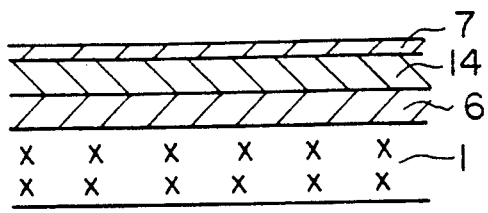
Figure 8B:
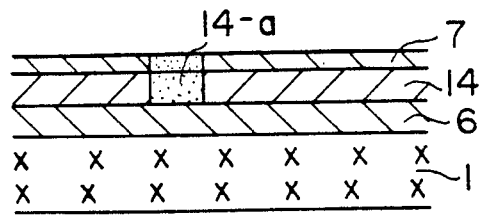
Figure 8C:
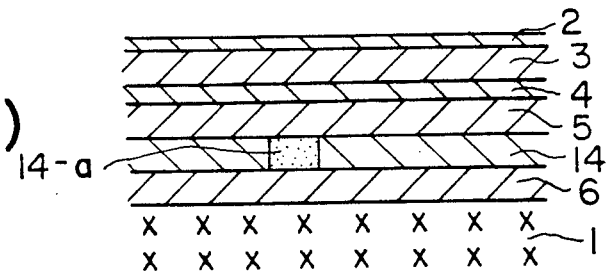
Figure 8D:
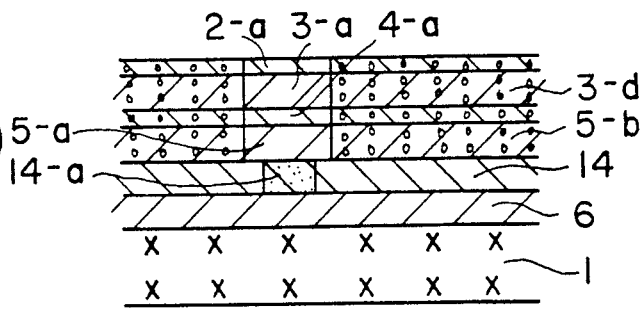
Figure 8E:
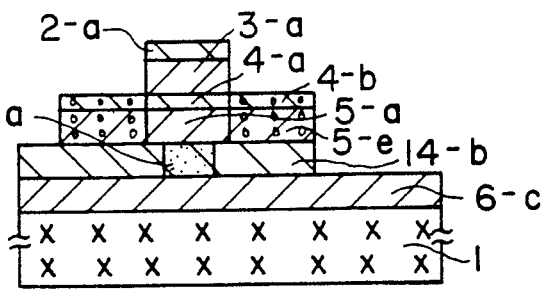
Figure 8F:
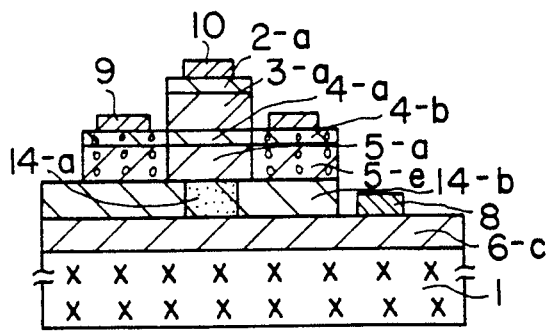

FIG. 8 illustrates a method of manufacturing an inverted type HBT according to this invention and an example of an HBT structure manufactured therewith. As shown in FIG. 8(a), there are epitaxially formed at first, on a substrate 1, a highly doped semiconductor material layer 6 of a type identical with that of an emitter, an undoped semiconductor material layer 14 for forming an emitter region and a passivation film layer 7. Then, as shown in FIG. 8(b), a portion of the undoped layer situated within a range just beneath an emitter region 5-a is converted into a highly doped region 14-a of a type identical with that of the emitter by means of ion implantation. Then, after removing the passivation film layer 7 in an epitaxial device, there are epitaxially formed, as shown in FIG. 8(c), at least a semiconductor material layer 5 for forming the emitter region, a semiconductor material layer 4 for forming a base region, a semiconductor material layer 4 for forming a collector region, a semiconductor material layer 3 for forming the collector region and a highly doped layer 2 of a type identical with that of the collector. Then, as shown in FIG. 8(d), the peripheral portion around the emitter region 5-a is converted into a region 5-b having carriers of a type identical with that of the base by means of ion inplantation. Then, the HBT device structure shown in FIG. 8(e) is formed by the same procedures as in Example 5 and an emitter electrode 8, a base electrode 9 and a collector electrode 10 are formed to manufacture an HBT according to this invention shown in FIG. 8(f).

In the structure according to this invention, the peripheral portion around the emitter region 5-a is converted into a semiconductor region 5-e having carriers of a type identical with that of the base and the layer below the emitter region 5-a comprises a highly doped region 14-a of a type identical with that of the emitter region 5-a, smaller in size than the emitter region 5-a and situated with a range just beneath the emitter region 5-a and an undoped semi-insulating region 14-b is formed at the periphery thereof.

For the semiconductor materials, there are employed in these examples highly doped n-type GaAs(n+-GaAs) as the material for forming the emitter ohmic contact, n-type $Al_xGa_{1-x}As$(N-$Al_xGa_{1-x}As$) as the emitter material, highly doped p-type GaAs(p-GaAs) as the base material, n type GaAs(n-GaAs) as the collector material, a highly doped n type GaAs(n+-GaAs) as the material for facilitating the formation of the collector ohmic contact, undoped GaAs (u-GaAs) as the undoped semi-insulating material for forming the collector, undoped $Al_xGa_{1-x}As$(U-$Al_xGa_{1-x}As$) as the undoped semi-insulating material for forming the emitter, and undoped GaAs(u-GaAs) as the un-doped semi-insulating material for forming the highly doped region of a minute size. However, other materials than above may be used for the bipolar transistor. For instance, it is also possible to use Si, Ge, GaAs, AlAs, InP, GaP, AlP or mixed crystals thereof, or those materials combining them with each other.

The materials for the passivation film usable in examples may be any of materials provided that they can be epitaxially formed as a dense film, can prevent the epitaxially formed underlying materials from being exposed to air or other like ingredients, and can be removed with ease without damaging the underlying epitaxially formed materials at such a temperature and in an atmosphere which will not cause the decomposition or evaporation of the underlying materials. In the GaAs-$Al_xGa_{1-x}As$ system of examples, there are used an epitaxially formed thin InAs film and an epitaxially formed passivation films comprising a dual layer structure of InAs and $Al_xGa_{1-x}As$. Since InAs can be removed in the form of InAs at a temperature and in an As atmosphere which does not cause GaAs to decompose, it is suitable in this material system. Although thinner InAs is desirable for easy removal in a short period of time, a certain thickness is required for protecting the surface. While on the other hand, although it is difficult in the case of the dual layer passivation film in which $Al_xGa_{1-x}As$ is formed on InAs to remove $Al_xGa_{1-x}As$ without damaging the underlying GaAs in an epitaxial device, $Al_xGa_{1-x}As$ with a relatively large x value can be removed simply by wet etching without damaging the InAs. If $Al_xGa_{1-x}As$ layer with a relative large x value is made thicker, since InAs can completely be prevented from being exposed to air or like other atmosphere, an AlAs passivation film can be formed so thin that it can be removed in a short period of time just before the epitaxy. It is extremely easy to selectively remove the $Al_xGa_{1-x}As$ layer just before placing the structure in the epitaxial device after carrying out the ion implantation or like other process and the time in which InAs is exposed to air can be shortened by placing the structure directly after the removal into the epitaxial device. Accordingly, the boundary can sufficiently be protected by a thin InAs layer and since the thin layer can easily be removed just before the epitaxy, it provides a great advantage in the process.

The materials usable for the passivation film layer include, in view of the decomposing or evaporizing temperature of the underlying epitaxially formed material, InAs, $In_xGa_{1-x}As$ or epitaxially formed thin film comprising a plurality of a layers in which at least $Al_xGa_{1-x}As$ is formed on InAs and InAs or $In_xGa_{1-x}As$ in the case of using GaAs, AlAs, GaP, InP, mixed crystal thereof or $In_xGa_{1-x}As$ as the underlying material; InAs, $In_xGa_{1-x}As$, GaAs, or an epitaxially formed thin film comprising a plurality of layers in which at least $Al_xGa_{1-x}As$ is formed on InAs, $In_xGa_{1-x}As$ or GaAs in the case of using $Al_xGa_{1-x}As$, Si, Ge or $Ge_xGa_{1-x}As$ as the underlying material; and InSb or $InSb_xAs_{1-x}$ in the case of using GaAs, AlAs, InAs, GaP, InP, mixed crystals thereof or Ge, Si or $Ge_xSi_{1-x}$ as the underlying material.

Although HBT is used as the bipolar transistor in the examples, the method of this invention is also applicable to BT for increasing the operation speed.

The epitaxially formed thin film comprising a plurality of layers containing InAs and $Al_xGa_{1-x}As$ formed thereover used in the examples can be applied not only to BT but also to the manufacture of those materials or devices which require the epitaxial process steps, other subsequent processing steps. In a semiconductor laser, for example, it is possible to apply a passivation film and a process for forming carrier-confining region outside of an epitaxial device and then to apply epitaxial growing steps again to thereby manufacture a semiconductor laser with a distinct carrier-confining region.

Further, although the passivation film is formed in the examples after forming the layer for the formation of a collector or after forming the layer below the layer for forming the collector in a normal type, while thereafter forming the layer for the formation of an emitter or after forming the layer below the layer for forming the emitter in an inverted type, other processes are of course possible. For instance, a passivation film may be formed after forming the layer for the formation of the base region or after forming the layer for the formation of the emiiter, and the passivation film subsequently removed and an epitaxial layer again formed.

As has been described above, in the case of introducing impurities to specific portions inside a multilayer structure of semiconductor materials of different properties this invention applies a manufacturing method, which comprises epitaxially forming a layer in which impurities are introduced, epitaxially forming thereover a passivation film that can be removed with ease by heating at a temperature and in an atmosphere under which the epitaxially formed materials described above are not decomposed or evaporized thereby protecting the epitaxially formed materials, then introducing impurities by appropriate means such as by ion implantation by introducing impurities to desired portions and, thereafter, removing the passivation film layer in an epitaxial device and then applying epitaxial growing again.

It is thus possible to manufacture a semiconductor device using a multilayer structure of semiconductor materials having different properties, in which impurities are additionally introduced at specific portions inside thereof, and in which the impurities are eliminated substantially abruptly at the boundary between the portion introduced with the impurities and the layer thereabove; according to the procedures the properties of the semiconductor vary substantially abruptly at the boundary between the layer introduced with the impurities and the layer thereabove and thus the crystals in the layer above the portion in which the impurities are included undergo no injuries. Accordingly, in a BT using the above-mentioned structure, the Cbc and Rb can be reduced and, thus, the $f_m$ can be increased, since it is possible to manufacture a normal type BT having an emitter disposed above, in which a minute collector having the semi-insulating region at the periphery of the collector region is present, impurities are not substantially present in the base region above the semi-insulating region at the periphery of the collector and crystals are not damaged. Further, it is also possible to manufacture BT in which a highly doped region of a type identical with that of the collector is formed at a portion situated within a range just beneath the collector region, a peripheral region thereof contain carriers of a type identical with that of the base, no impurities hindering the transistor operation are included in the peripheral portion around the collector region or the base region thereabove and crystals are not damaged. This enables one to manufacture a BT with a decreased Cbc and increased $f_m$.

In an inverted type BT in which the collector is disposed above, since it is possible to manufacture a BT of a structure in which the collector and the emitter are replaced with each other, it is possible to improve the Cbc by decreasing the size of the collector disposed above, as well as to remarkably increase the $f_t$ and $f_m$ by reducing the Ceb and Rb with the above-mentioned structure.

Further, in addition to a method of using a single layer of a passivation film for the surface of epitaxially grown layer, that can be removed with ease by heating at a temperature and in an atmosphere under which the epitaxially formed materials are not decomposed or evaporated, it is also possible to employ a method of applying a protection film of a multilayer structure comprising a plurality of layers in which an epitaxially formed layer composed of a material that can be removed selectively by etching is formed over the above-mentioned passivation film, practicing ion implantation or like other process, rapidly remove the passivation film the above just prior to the succeeding, and to remove the passivation film of the lower layer in an epitaxial device and then applying the epitaxial growing again. According to such procedure it is possible to manufacture a multistructure of semiconductor materials of different perties, wherein the semiconductor has no high resistance properties at the boundary between. the layer protected so far and the succeeding epitaxial layer due to the effect of the external atmosphere and the properties of the semiconductor vary substantially abruptly at the boundary. Various semiconductor devices of high performance using these same materials can also be produced.

What is claimed is:

1. A method of manufacturing a semiconductor device using a multilayer structure of semiconductor materials in which impurities additionally introduced to a specific portion of the semiconductor materials are eliminated abruptly at a boundary between a semiconductor layer introduced with the impurities and a layer thereabove and the properties of the semiconductors vary abruptly at said boundary, said method comprising the steps of epitaxially forming, on a substrate, a semiconductor material layer and a passivation film thereover for preventing the epitaxially formed semiconductor material layer from contacting the atmosphere during a subsequent step of introducing impurities, introducing impurities to a specific portion of said epitaxially formed semiconductor material layer, removing said passivation film in an epitaxy device, and further epitaxially forming on said semiconductor material layer at least another semiconductor material layer.

2. A method of manufacturing a semiconductor device as defined in claim 1 which forms, as the epitaxially formed semiconductor material layer to be introduced with impurities, a layer of GaAs, AlAs, GaP, InP, mixtures thereof or $In_xAl_{1-x}As$ and forms, as the epitaxially formed passivation film, a film of InAs or $In_xGa_{1-x}As$ or a film comprising a first film of InAs or $In_xGa_{1-x}As$ and a second film of $Al_xGa_{1-x}As$ formed on the first film.

3. A method of manufacturing a semiconductor device as defined in claim 1 which forms, as the epitaxially formed semiconductor material layer to be introduced with impurities, a layer of $Al_xGa_{1-x}As$, Ge or $Ge_xSi_{1-x}$ and forms, as the epitaxially formed passivation film, a film of InAs, $In_xAl_{1-x}As$ or GaAs or a film comprising a first film of InAs, $In_xAl_{1-x}As$ or GaAs and a second film of $Al_xGa_{1-x}As$ formed on the first film.

4. A method of manufacturing a bipolar transistor having a collector region, a base region and an emitter region which are formed in this order on a substrate, said method comprising the steps of:
epitaxially forming at least a first semiconductor material layer for forming the collector region and a passivation film in this sequence;
introducing impurities to the first semiconductor material layer, except for a specific part thereof which becomes the collector region, to make the first semiconductor material layer, except for said specific part, semi-insulating;
eliminating said passivation film;
epitaxially forming on the first semiconductor material layer at least a second semiconductor material layer for forming the base region and a third semiconductor material layer for forming the emitter region in this sequence; and
patterning the second and third semiconductor material layers into specific patterns, respectively.

5. A method as defined in claim 4, wherein the emitter region is made of a semiconductor material having a band gap greater than that of a semiconductor material used for making the base region.

6. A method of manufacturing a bipolar transistor having a collector region, a base region and an emitter region which are formed in this order on a substrate, said method comprising the steps of:
epitaxially forming a first semiconductor material layer which is a highly doped semiconductor material layer for forming a collector ohmic contact region and a passivation film in this sequence;
introducing impurities to the first semiconductor material layer except for a specific part thereof which becomes the collector ohmic contact region to make the first semiconductor material layer, except for said specific part, semi-insulating;
removing said passivation film;
epitaxially forming on the first semiconductor material layer at least a second semiconductor material layer for forming the collector region, a third semiconductor material layer for forming the base region and a fourth semiconductor material layer for forming the emitter region in this sequence;
introducing impurities to the second semiconductor material layer, except for a specific part thereof which becomes the collector region, to make the second semiconductor material layer, except for said specific part thereof, into a region having carriers of a type identical with that of the base region, said specific part of the second semiconductor material layer being larger in area than said specific part of the first semiconductor material layer; and
patterning the third and fourth semiconductor material layers into specific patterns, respectively.

7. A method as defined in claim 6, wherein the emitter region is made of a semiconductor material having a band gap greater than that of a semiconductor material used for making the base region.

8. A method of manufacturing a bipolar transistor having a collector region, a base region and an emitter region which are formed in this order on a substrate, said method comprising the steps of:
epitaxially forming a first semiconductor material layer which is a highly doped semiconductor material layer of a type identical with that of the collector region, a second semiconductor material layer which is an un-doped semiconductor material layer for forming the collector region and a passivation film in this sequence;
introducing impurities to the second semiconductor material layer at a specific part thereof to make said specific part into the collector region;
removing the passivation film;
epitaxially forming on the second semiconductor material layer at least a third semiconductor material layer for forming the base region and a fourth semiconductor material layer for forming the emitter region in this sequence; and patterning the third and fourth semiconductor material layers into specific patterns, respectively.

9. A method as defined in claim 8, wherein the emitter region is made of a semiconductor material having a band gap greater than that of a semiconductor material used for making the base region.

10. A method of manufacturing a bipolar transistor having a collector region, a base region and an emitter region which are formed in this order on a substrate, said method comprising the steps of:
epitaxially forming a first semiconductor material layer which is a highly doped semiconductor material layer of a type identical with that of the collector region, a second semiconductor material layer which is an un-doped semiconductor material layer and a passivation film in this sequence;
introducing impurities to the second semiconductor material layer at a specific part thereof to convert said specific part into a highly doped region of a type identical with the collector region;
removing the passivation film;
epitaxially forming on the second semiconductor material layer at least a third semiconductor material layer for forming the collector region, a fourth semiconductor material layer for forming the base region and a fifth semiconductor material layer for forming the emitter region in this sequence;
introducing impurities to the third semiconductor material layer except for a specific part thereof which becomes the collector region to convert the third semiconductor material layer, except for said specific part thereof, into a region having carriers of a type identical with that of the base region, said specific part of the third semiconductor material layer being larger in area than said specific part of the second semiconductor material layer; and
patterning the fourth and fifth semiconductor material layers into specific patterns, respectively.

11. A method as defined in claim 10, wherein the emitter region is made of a semiconductor material having a band gap greater than that of a semiconductor material used for making the base region.

12. A method of manufacturing a bipolar transistor having an emitter region, a base region and a collector region which are formed in this order on a substrate, said method comprising the steps of:
epitaxially forming at least a first semiconductor material layer for forming the emitter region and a passivation film in this sequence;
introducing impurities to the first semiconductor material layer, except for a specific part thereof which becomes the emitter region, to make the first semiconductor material layer, except for said specific part, semiinsulating;
eliminating said passivation film;
epitaxially forming on the first semiconductor material layer at least a second semiconductor material layer for forming the base region and a third semiconductor material layer for forming the collector region in this sequence; and
patterning the second and third semiconductor material layers into specific patterns, respectively.

13. A method as defined in claim 12, wherein the emitter region is made of a semiconductor material having a band gap greater than that of a semiconductor material used for making the base region.

14. A method of manufacturing a bipolar transistor having an emitter region, a base region and a collector region which are formed in this order on a substrate, said method comprising the steps of:
epitaxially forming a first semiconductor material layer which is a highly doped semiconductor material layer for forming an emitter ohmic contact region and a passivation film in this sequence;
introducing impurities to the first semiconductor material layer, except for a specific part thereof which becomes the emitter ohmic contact region, to make the first semiconductor material layer, except for said specific part, semi-insulating;
removing the passivation film;
epitaxially forming on the first semiconductor material layer at least a second semiconductor material layer for forming the emitter region, a third semiconductor material layer for forming the base region and a fourth semiconductor material layer for forming the collector region in this sequence;
introducing impurities to the second semiconductor material layer, except for a specific part thereof which becomes the emitter region, to make the second semiconductor material layer, except for said specific part thereof, into a region having carriers of a type identical with that of the base region, said specific part of the second semiconductor material layer being larger in area than said specific part of the first semiconductor material layer; and
patterning the third and fourth semiconductor material layers into specific patters, respectively.

15. A method as defined in claim 14, wherein the emitter region is made of a semiconductor material having a band gap greater than that of a semiconductor material used for makiing the base region.

16. A method of manufacturing a bipolar transistor having an emitter region, a base region and a collector region which are formed in this order on a substrate, said method comprising the steps of:
epitaxially forming a first semiconductor material layer which is a highly doped semiconductor material layer of a type identical with that of the emitter region, a second semiconductor material layer which is an un-doped semiconductor material layer for forming the emitter region and a passivation film in this sequence;
introducing impurities to the second semiconductor material layer at a specific part thereof to make said specific part into the emitter region;
removing the passivation film;
epitaxially forming on the second semiconductor material layer at least a third semiconductor material layer for forming the base region and a fourth semiconductor material layer for forming the collector region in this sequence; and
patterning the third and fourth semiconductor material layers into specific patterns, respectively.

17. A method as defined in claim 16, wherein the emitter region is made of a semiconductor material having a band gap greater than that of a semiconductor material used for making the base region.

18. A method of manufacturing a bipolar transistor having an emitter region, a base region and a collector region which are formed in this order on a substrate, said method comprising the steps of:
epitaxially forming a first semiconductor material layer which is a highly doped semiconductor material layer of a type identical with that of the emitter region, a second semiconductor material layer which is an un-doped semiconductor material layer and a passivation film in this sequence;

introducing impurities to the second semiconductor material layer at a specific part thereof to convert said specific part into a highly doped region of a type identical with the emitter region;

removing said passivation film;

epitaxially forming on the second semiconductor material layer at least a third semiconductor material layer for forming the emitter region, a fourth semiconductor material layer for forming the base region and a fifth semiconductor material layer for forming the collector region in this sequence;

introducing impurities to the third semiconductor material layer, except for a specific part thereof which becomes the emitter region, to convert the third semiconductor material layer, except for said specific part thereof, into a region having carriers of a type identical with that of the base region, said specific part of the third semiconductor material layer being larger in area than said specific part of the second semiconductor material layer; and patterning the fourth and fifth semiconductor material layers into specific patterns, respectively.

19. A method as defined in claim 18, wherein the emitter region is made of a semiconductor material having a band gap greater than that of a semiconductor material used for making the base region.

* * * * *